United States Patent [19]

Hein et al.

[11] Patent Number: 4,902,913
[45] Date of Patent: Feb. 20, 1990

[54] ANALOG COMPARATOR

[75] Inventors: Jerrell P. Hein, Spring Township, Berks County; Thayamkulangara R. Viswanathan, Wyomissing Hills, both of Pa.

[73] Assignee: American Telephone and Telegraph Company, Murray Hill, N.J.

[21] Appl. No.: 214,086

[22] Filed: Jul. 1, 1988

[51] Int. Cl.[4] .............................................. H03K 5/24
[52] U.S. Cl. .................................... 307/362; 307/491; 307/494
[58] Field of Search ............... 307/350, 362, 363, 491, 307/494

[56] References Cited

U.S. PATENT DOCUMENTS

| 4,074,150 | 2/1978 | Buckley III et al. | 307/362 |
| 4,521,696 | 6/1985 | Raghunathan | 307/350 |
| 4,542,303 | 9/1985 | Jarrett et al. | 307/362 |
| 4,791,318 | 12/1988 | Lewis et al. | 307/362 |

OTHER PUBLICATIONS

"Bipolar and MOS Analog Integrated Circuit Design", Alan B. Grebene, Micro-Linear Corporation, Sunnyvale, Calif., published by John Wiley & Sons, Integrated-Circuit Oscillators and Timers, p. 584.

Primary Examiner—John Zazworsky
Attorney, Agent, or Firm—Scott W. McLellan

[57] ABSTRACT

A novel analog comparator having cascaded gain stages powered by two buses, the voltages on which are dependent on a reference input voltage. A network, responsive to the reference input voltage, sets the voltages on the buses and isolates the buses from external power and ground to achieve high power supply and ground noise immunity. An alternative design of the network is provided which removes errors in the accuracy of the comparator resulting from differing drain-to-source voltages across the various transistors. The accuracy of the comparator is then dependent on the accuracy of matching predetermined ratios of the sizes of the transistors.

17 Claims, 3 Drawing Sheets

ANALOG COMPARATOR

CROSS-REFERENCE TO RELATED APPLICATION

This application is a companion application of Ser. No. 214,516, now U.S. Pat. No. 4,818,929 having a common assignee and filed simultaneously herewith, titled "Fully Differential Analog Comparator", by J. L. Sonntag, T. R. Viswanathan and W. B. Wilson.

BACKGROUND OF THE INVENTION

1. Field of the Invention

This invention relates to an integrated circuit technique for producing an accurate high-speed analog comparator with low power consumption.

2. Description of the Prior Art

An analog comparator is a basic functional unit utilized in analog circuit design, as, for example, in analog-to-digital converters (ADCs). The relative performance of analog comparators is measured by their specifications, such as input offset voltage, offset current, propagation delay, skew, power consumption, etc. In some applications, the input offset voltage and offset current specification can be relaxed (traded off) when other performance criteria are critical. For example, in optical and digital data receivers or in high speed medium resolution ADCs having embedded analog comparators, e.g., those used in video applications (eight or nine bit resolution with ten megahertz conversion rates), low propagation delay through the analog comparators is the most important criteria. Alternatively, in low speed medium resolution ADCs having embedded analog comparators, e.g., ADCs used in telephone (voice) applications where many thousands thereof are employed in channel banks and line cards of switching systems (eight to twelve bits resolution, eight kilohertz conversion rates), the power consumption of the analog comparators is of primary importance. Hence, it is desirable to have a single analog comparator design easily adaptable for any application.

SUMMARY OF THE INVENTION

We have invented a novel analog comparator having a minimum power/delay product allowing a tradeoff between speed and power consumption depending on the desired application. The comparator has very low sensitivity to power supply noise, and the gain of the comparator can be scaled as needed. Additionally, the comparator can be adapted such that the ultimate accuracy of the comparator is limited by variations in the sizes of transistors thereof.

These and other advantages are obtained generally by having cascaded gain stages powered by first and second buses, the input of the first of the cascaded gain stages being coupled to the unknown input of the comparator; a first transistor having output terminals coupling between the first bus and a first power source and the input terminal coupling to the reference input; a first current source for supplying current to the first bus; a second transistor having output terminals coupling between a second voltage source and the second bus and the input terminal coupling to the reference input; a second current source coupling between the second bus and the first voltage source and supplying a current substantially equal to the current from the first current source; and a digital inverter responsive to the output of the cascaded gain stages. Each of the cascaded gain stages comprises two transistors of differing polarity, the input terminals of the two transistors coupled together to form the input to the gain stage, two corresponding output terminals from the two transistors coupled together to form the output of the gain stage, and the remaining output terminals of the two transistors forming the power terminals of the gain stage.

In addition, the accuracy (offset voltage) of the comparator is improved by adapting the first and second transistors and the second current source to include a subtractor and an integrator to equalize differing drain-to-source voltages on all transistors in the comparator. This improvement leaves the accuracy of the comparator dependent on variations of the sizes of the transistors, which can be easily controlled during manufacture thereof.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
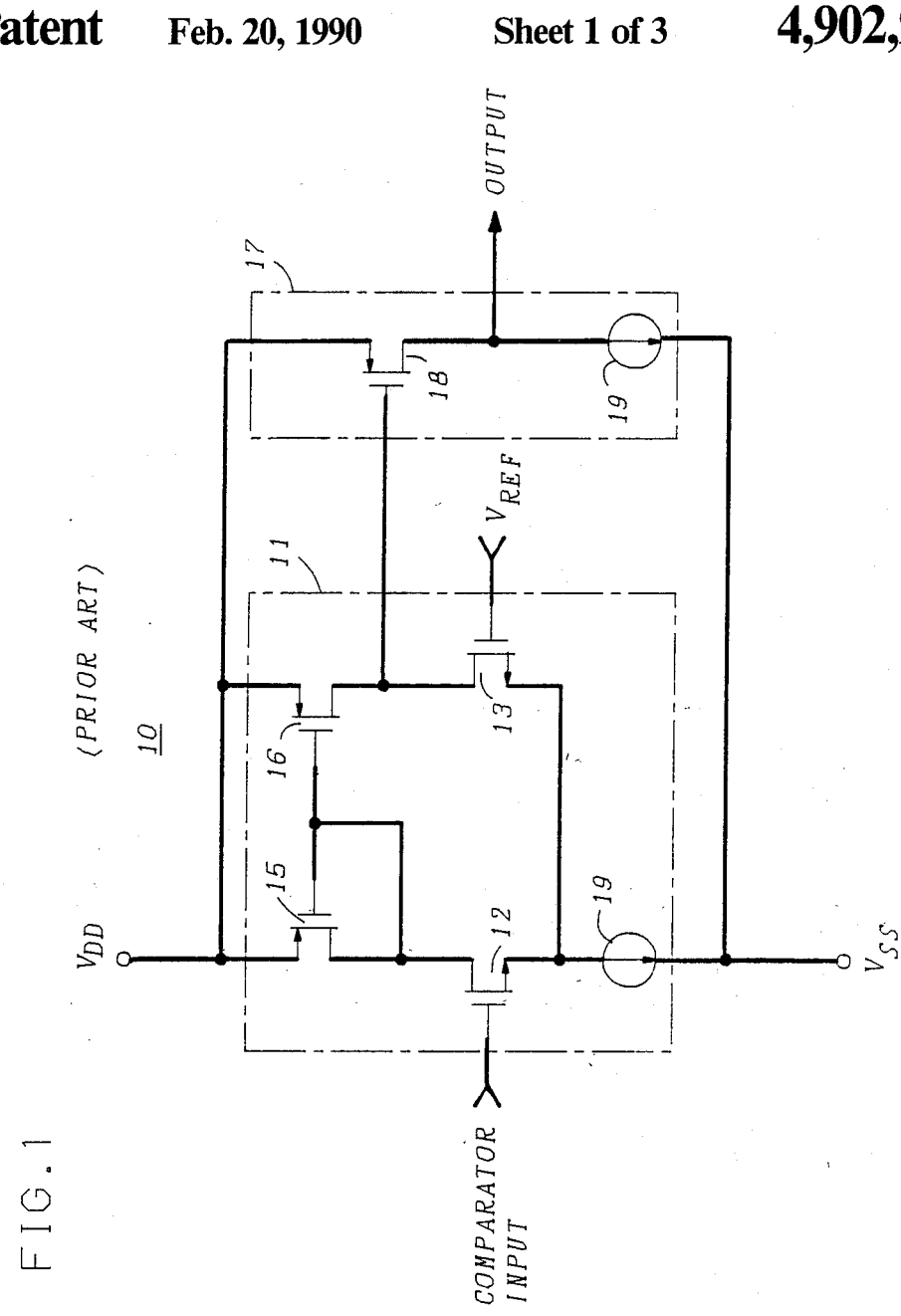
FIG. 1 is an analog comparator of the prior art.

In FIG. 1, a schematic of analog comparator 10 is shown as known in the prior art. A differential input stage 11 is formed by a differential input amplifier having field-effect transistors (FETs) 12, 13 and current source 14 driving a conventional current mirror of FETs 15, 16. The output of stage 11 drives an amplifier 17 formed by FET 18 and current source 19 as a load for FET 18. Output of the comparator 10 is taken from the amplifier 17. This design suffers from a propagation delay skew, i.e., the propagation delay from the comparator input going from greater than the voltage reference input $V_{ref}$ to less than $V_{ref}$ is different from going from less than $V_{ref}$ to greater than $V_{ref}$. For the most part, this propagating delay skew is a result of the asymmetric design of the differential input stage 11. The most notable asymmetry being the path from the comparator input through FET 12, through the current mirror of FETs 15,16 to amplifier 17. In contrast, the path from $V_{ref}$ to the amplifier 17 is only through FET 13. Overall propagation delay through the comparator 10 is high due to the number of FETs a signal propagates through to reach the output of comparator 10 from the comparator input. Further, this structure suffers from poor noise immunity from the $V_{dd}$ power supply. Still further, the overall gain of the comparator 10 will be limited when short-channel FETs are used. Short channel FETs suffer from reduced gain due to increased output conductance, which increases the loading of all nodes in the stage 11 and in the amplifier 17, reducing the overall gain.

Figure 2:
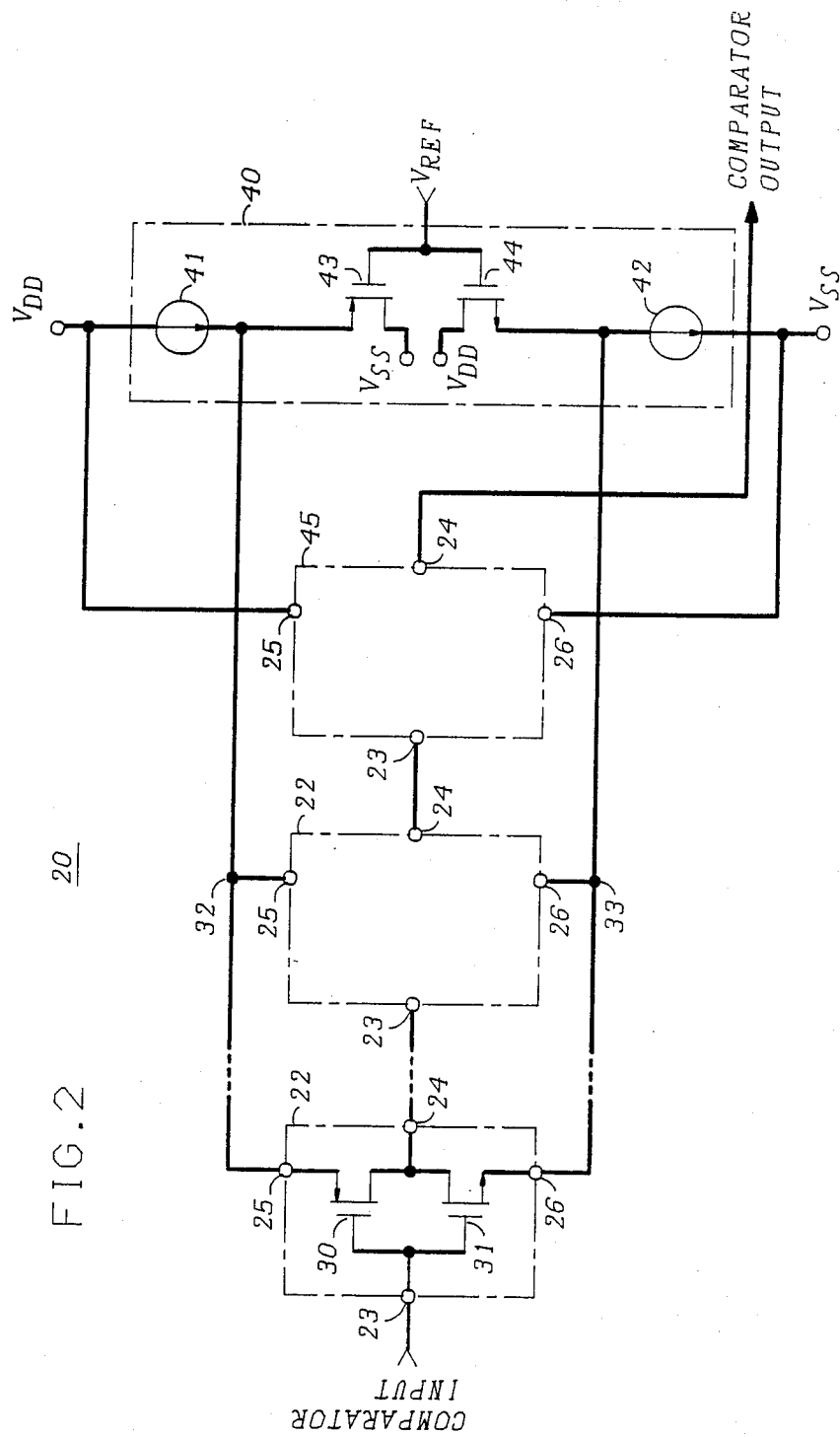
FIG. 2 is a schematic of the analog comparator according to the invention.

A novel analog comparator 20 is shown schematically in FIG. 2 and is preferably integrated into a common substrate. Gain stages 22 are cascaded to provide a predetermined amount of voltage gain to the comparator 20. At least one stage, and typically no more than two or three stages, is necessary. Each gain stage 22 resembles a conventional CMOS inverter, having an input terminal 23, an output terminal 24 and two power supply terminals 25, 26. A P-channel FET 30 and an N-channel FET 31 have common gates coupling to the input terminal 23 and common drains coupling to output terminal 24. Although shown here as P-and N-channel FETs, it is understood that the P- and N-FETs can be interchanged with a corresponding change in power supply polarity. The source of FET 30 couples to power terminal 25 while the source of FET 31 couples to power terminal 26. The ratio of the sizes of FET 30 to FET 31 will be discussed in more detail below, but it is sufficient to state here that the conventional sizing ratio of FET 30 to FET 31, being approximately three to one, will produce a comparator 20 having substantially zero propagation delay skew.

The power terminals 25, 26 of cascaded gain stages 22 couple to corresponding buses 32, 33. The voltages on these buses 32, 33 are determined by network 40. Network 40 has two current sources 41, 42 providing substantially the same current, referred to here as $I_b$. Ranges for the current from sources 41, 42 vary between one microamperes and one milliampere depending on the desired propagation delay (speed) of the comparator 20, as discussed above. Current sources 41, 42, although not shown in any detail, have very high output resistance, such as cascaded Widlar current sources or Wilson current sources. The current sources 41, 42 are preferably referenced to a common reference voltage or current to assure substantially identical current flow. Current source 41 drives bus 32 and the source of P-channel FET 43. Similarly, current source 42 drives bus 33 and the source of N-channel FET 44. Gates of FETs 43, 44 couple to the reference voltage input, $V_{ref}$, of the comparator 20. The drains of FETs 43, 44 couple to $V_{ss}$, the most negative supply voltage, and to $V_{dd}$, the most positive supply voltage, respectively. The current sources 41,42 serve to isolate the buses 32,33 from power supplies $V_{dd}$ and $V_{ss}$ allowing the comparator 20 to have high power supply noise immunity. As stated above, polarity types of FETs 43 and 44 are shown as exemplary, the polarity types of which can be interchanged with the corresponding change in polarity of the power supply voltages, $V_{ss}$ and $V_{dd}$, the interchange of the FETs 30, 31 in the stages 20 and the reversal of current from sources 42, 43.

The voltage on bus 32 is established as:

$$V_{ref} + \sqrt{I_b/K_p + V_{tp}} \ ;$$

and the voltage on bus 33 is established as:

$$V_{ref} - \sqrt{I_b/K_n - V_{tn}} \ .$$

Where $I_b$ is the current supplied by current sources 41, 42, $V_{tp}$ and $V_{tn}$ are the threshold voltages of FETs 43, 44, respectively, and $K_p$ and $K_n$ are device constants derived from the size and type of FETs:

$$K_p = K_p' W_p/L_p;$$

for the P-channel transistor 43, and $$K_n = K_n' W_n/L_n.$$

Where $K_p'$ and $K_n'$ are constants (mobility factors) corresponding to the conductivity type of the FETs 43, 44, $W_p/L_p$ and $W_n/L_n$ are the width-to-length ratios of the FETs 43, 44, respectively. Typically, the constant $K_p'$ is one-third $K_n'$, so for illustrative purposes here, the $W_p/L_p$ ratio for FET 43 is made to be three times the $W_n/L_n$ ratio for FET 44. In this case, $K_p$ and $K_n$ are substantially the same.

However, $W_p/L_p$ for FET 43 need not be three times that of FET 44 for proper operation of the comparator 20, proper operation thereof having the threshold point for comparator 20 being substantially equal to $V_{ref}$. The limitation for proper operation of the comparator 20 has the ratio of the $W_p/L_p$ to the $W_n/L_n$ for FETs 43, 44 and is required to be the same for all FETs 30, 31 in the stages 22. More specifically, this can be expressed as:

$$\frac{(W/L \text{ of FET } 30)}{(W/L \text{ of FET } 31)} = \frac{(W/L \text{ of FET } 43)}{(W/L \text{ of FET } 44)}$$

Wherein W/L indicates the width-to-length ratio for the indicated FETs. So long as this ratio is kept for all stages 22 the comparator will work correctly, i.e., the threshold voltage for comparator 20 is substantially $V_{ref}$. Therefore, the sizing of the FETs in the gain stages 22 and, correspondingly, the FETs 43, 44 can be sized for the required purpose: a three-to-one ratio for minimum propagation delay skew and one-to-one for minimum propagation delay.

The output of cascaded gain stages 22 drives buffer 45, operating as a conventional CMOS digital inverter. Although only one buffer 45 is shown, it is understood that multiple, cascaded buffers 45 can be used. The output terminal 24 of buffer 45 is the output of comparator 20. Buffer 45 is substantially the same as gain stage 22. However, the power supply terminals 25, 26 couple to power sources $V_{dd}$ and $V_{ss}$ instead of buses 32, 33. Typically, the sizing of the FETs in buffer 45, corresponding to FETs 30, 31 in stage 22, is three-to-one, respectively, for minimum propagation delay skew and a threshold voltage of approximately one-half the voltage difference between $V_{dd}$ and $V_{ss}$.

Figure 3:
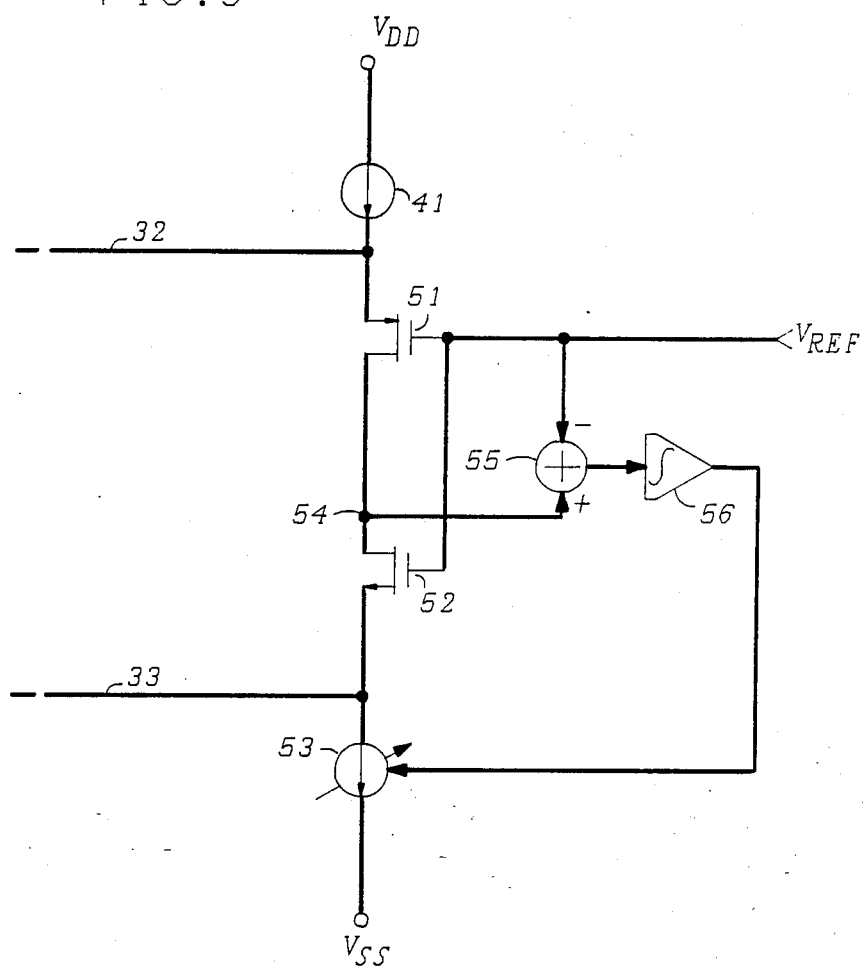
FIG. 3 is an improvement to the analog comparator of FIG. 2.

A source of error resulting in the improper operation of the comparator 20, i.e., the threshold voltage of the comparator 20 not equaling the reference voltage, $V_{ref}$, derives from differing drain-to-source voltages across the FETs 30, 43 and 31, 44 when the comparator input voltage approaches the reference voltage, $V_{ref}$. This error is aggravated when short-channel FETs are used as FETs 30,31 and 43,44 due to large output conductances of this type of FET. In FIG. 2, the voltage across FET 43 is the difference between the voltage on bus 32, as expressed above, and $V_{ss}$ while the voltage across FET 30 is roughly the voltage on bus 32 less $V_{ref}$ (when the comparator input voltage is substantially $V_{ref}$); similarly with FETs 31 and 44. Due to non-ideal characteristics of manufacturable FETs, particularly with short channel FETs as noted above, the current through FET 43 will be different from the current through FET 30, making the voltage on bus 32 deviate from the desired voltage as expressed above. This results in the threshold voltage of comparator 20 having a small (several millivolt) deviation from $V_{ref}$. To overcome this error, for example in applications where comparator accuracy is paramount, the circuit in FIG. 2 is adapted to use in place of the network 40 in FIG. 2 the circuit in FIG. 3 and is preferably integrated into the same substrate as the circuitry in FIG. 2. As shown in FIG. 3, buses 32, 33 and current source 41 remain as in FIG. 2. The source of P-channel FET 51 couples to bus 32 and current source 41 and the source of N-channel FET 52 couples to bus 33 and variable current source 53. The gates of FETs 51, 52 couple to the reference voltage input $V_{ref}$. The drains of FETs 51, 52 couple together at node 54 and drive subtractor 55. It is noted that the configuration of FETs 51, 52 are similar to corresponding FETs 30, 31 in stage 22 (FIG. 2.) As was discussed above, for proper operation of the comparator 20 (FIG. 2), the ratio of the width to length ratios of FETs 51, 52 are substantially the same as the ratio of the width to length ratios of FETs 30, 31 of stage 22 in FIG. 2. Subtractor 55, responsive to node 54, is also responsive to $V_{ref}$, thereby generating an error signal indicating the deviation of the voltage on node 54 from $V_{ref}$. Integrator 56 responds to the error signal and in turn drives variable current source 53.

The accuracy of the comparator 20 (FIG. 2) is improved by forcing the drain-to-source voltages on the FETs 51, 52 to substantially match corresponding drain-to-source voltages on FETs 30, 31 (FIG. 2) (when the comparator input voltage is substantially $V_{ref}$) by insuring that the voltage on node 54 is substantially $V_{ref}$. To do so, integrator 56 integrates the error signal from subtractor 55 until a sufficient current is flowing through source 53 so that the node 54 is substantially at $V_{ref}$. This results in node 54 being held substantially at $V_{ref}$ as long as the voltage of $V_{ref}$ does not vary faster than the time constant of the integrator 56. Therefore, the resulting accuracy of the comparator 20 (FIG. 2) will be improved, leaving the accuracy of the comparator 20 dominated by the matching of the various width-to-length ratios of the FETs 30,31 (FIG. 2) to FETs 51,52 as stated above.

Having described the preferred embodiments of this invention, it will now be apparent to one of skill in the art that other embodiments incorporating concepts disclosed herein may be used. It is felt, therefore, that this invention should not be limited to the disclosed embodiments, but rather should be limited only by the spirit and scope of the appended claims.

We claim:

1. An analog comparator formed on an integrated circuit for comparing first voltage input to a second voltage input characterized by:
    at least one cascadable gain stage, the stage having an input, an output and first and second power terminals, the corresponding power terminals coupling to first and second buses, the input of the cascadable gain stage coupling to the first voltage input of the comparator;
    a first transistor of a first polarity type having two output terminals and an input terminal, corresponding output terminals coupling to the first bus and directly to a first voltage source, and the input terminal coupling to the second voltage input;
    a second transistor of a second polarity type having two output terminals and an input terminal, corresponding output terminals coupling to the second bus and directly to a second voltage source, the input terminal coupling to the second voltage input;
    a first current source for supplying current to the first bus; and,
    a second current source for supplying current to the second bus, the amount of current being substantially equal to the current supplied by the first current source;
    wherein the voltage of the first voltage source is different from the voltage of the second voltage source.

2. The analog comparator recited in claim 1, further comprising:
    at least one digital inverter responsive to the output of the cascaded gain stages.

3. The analog comparator recited in claim 2, wherein the cascadable gain stage comprises a first transistor of a first polarity and a second transistor of a second polarity, each transistor having two output terminals and an input terminal, the input terminals of the two transistors coupling together to form the input to the gain stage, two corresponding output terminals from the two transistors coupling together to form the output of the gain stage, and the remaining output terminals of the two transistors forming the corresponding first and second power terminals of the gain stage.

4. The analog comparator recited in claim 3, wherein the digital inverter is a conventional CMOS digital inverter.

5. The analog comparator recited in claim 4, wherein the first voltage source has a voltage substantially of zero volts.

6. The analog comparator recited in claim 5, wherein the second voltage input couples to a reference voltage.

7. The analog comparator recited in claim 6, wherein transistors of the first polarity type are P-channel FETs and transistors of the second polarity type are N-channel FETs.

8. An analog comparator in an integrated circuit for comparing a first voltage input to a second voltage input characterized by:
    at least one cascadable gain stage, the stage having an input, an output and first and second power terminals, the corresponding power terminals being coupling to first and second buses, the input of the first of the cascaded gain stages coupling to the first voltage input;
    a first transistor of a first polarity type having two output terminals and an input terminal, corresponding output terminals coupling to the first bus and to a node, the input terminal coupling to the second voltage input;
    a second transistor of a second polarity type having two output terminals and an input terminal, corresponding output terminals coupling between the second bus and the node, the input terminal coupling to the second voltage input;
    a current source coupling to the first bus;
    a subtractor having two inputs and an output, corresponding inputs coupling to the node and the second voltage input;
    an integrator responsive to the output of the subtractor; and,
    a variable current source, responsive to the integrator, for sinking current from the second bus;
    wherein the current supplied by the variable current source varies in response to the integrator until the voltage on the node is substantially the same as the voltage on the second voltage input.

9. The analog comparator recited in claim 8, further comprising:
    at least one digital inverter responsive to the output of the cascadable gain stage.

10. The analog comparator recited in claim 9, wherein the cascadable gain stage comprises a first transistor of a first polarity and a second transistor of a second polarity, each transistor having two output terminals and an input terminal, the input terminals of the two transistors coupling together to form the input to the gain stage, two corresponding output terminals from the two transistors coupling together to form the output of the gain stage, and the remaining output terminals of the two transistors forming the corresponding first and second power terminals of the gain stage.

11. The analog comparator recited in claim 10, wherein the digital inverter is a conventional CMOS digital inverter.

12. The analog comparator recited in claim 11, wherein the second voltage input couples to a reference voltage.

13. The analog comparator recited in claim 12, wherein transistors of the first polarity type are P-channel FETs and transistors of the second polarity type are N-channel FETs.

14. A method for comparing first and second voltages, comprising the steps of:
   biasing first and second buses to predetermined voltages substantially dependent only on the first voltage; and,
   amplifying the second voltage with at least one cascadable gain stage powered by the first and second buses;
   wherein the amplified second voltage indicates whether the second voltage is greater than or less than the first voltage.

15. The method for comparing first and second voltages of claim 14, wherein the first and second buses are powered by corresponding current sources.

16. The method for comparing first and second voltages of claim 15, wherein the biasing of the first and second buses further comprises the steps of:
   amplifying the first voltage by a gain stage similar to a gain stage of the cascadable gain stage and powered by the first and second buses;
   subtracting the first voltage from the amplified first voltage to form an error voltage; and,
   adjusting one of the current sources in response to the error voltage until the amplified first voltage is substantially the same as the first voltage.

17. The method for comparing first and second voltages of claim 16, further comprising the step of integrating the error voltage; wherein the adjustable current source is responsive to the integrated error voltage.

* * * * *